US007259590B1

(12) United States Patent
Anderson et al.

(10) Patent No.: US 7,259,590 B1
(45) Date of Patent: Aug. 21, 2007

(54) DRIVER FOR MULTI-VOLTAGE ISLAND/CORE ARCHITECTURE

(75) Inventors: Brent A. Anderson, Jericho, VT (US); Andres Bryant, Burlington, VT (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 10 days.

(21) Appl. No.: 11/276,169

(22) Filed: Feb. 16, 2006

(51) Int. Cl.
*H03K 19/0185* (2006.01)
(52) U.S. Cl. ............................ 326/81; 326/121; 326/62; 327/333
(58) Field of Classification Search .................. 326/62, 326/80, 81, 121; 327/333
See application file for complete search history.

(56) References Cited

U.S. PATENT DOCUMENTS 6,731,154 B2 * 5/2004 Bednar et al. .............. 327/383

* cited by examiner

*Primary Examiner*—Daniel Chang
(74) *Attorney, Agent, or Firm*—Michael J. LeStrange; Hoffman, Warnick & D'Alessandro LLC

(57) ABSTRACT

A system and method for providing a driver for a multi-voltage island/core architecture of an integrated circuit chip are provided. A complementary metal oxide semiconductor (CMOS) inverter is built with a high threshold voltage p-channel field-effect transistor (hi-Vt PFET) and a regular threshold voltage n-channel field-effect transistor (NFET), which uses the maximum positive voltage supply (Vdd) on the chip. The threshold voltage of the hi-Vt PFET is determined based on the maximum Vdd, the Vdd of the Voltage island/core that drives the CMOS inverter, and a subthreshold leakage current requirement of the hi-Vt PFET.

11 Claims, 1 Drawing Sheet

DRIVER FOR MULTI-VOLTAGE ISLAND/CORE ARCHITECTURE

BACKGROUND OF THE INVENTION

1. Technical Field

The invention relates generally to multi-voltage island/core architectures, and more particularly, to a driver for a multi-voltage island/core architecture.

2. Background Art

As complementary metal oxide semiconductor (CMOS) technologies are scaled, total chip power dissipation is becoming high and is limiting the performance of an integrated circuit chip. Simultaneously, static (leakage) power dissipation is becoming a significant component of total chip power dissipation. A multi-voltage island/core architecture is a solution to the power dissipations. A multi-voltage island/core architecture is designed to independently adjust the voltage supply (Vdd) of each function block in an integrated circuit chip so that the total and the static power dissipation is minimized for each function block while still meeting the chip performance requirements. Each function block with a voltage supply may be referred to as a voltage island/core. One problem is how to build a driver between two voltage islands/cores that have different Vdd.

A CMOS inverter may be used as a driver between two voltage islands/cores. However, a CMOS inverter also has the problem of leakage, i.e., subthreshold leakage current. Raising threshold voltage of a CMOS inverter may reduce leakage and may increase noise margin, but may also result in serious loss in performance, for example, prolonged rise time. As such, the choice of the threshold voltage has to represent a trade-off between subthreshold leakage current and performance.

Based on the above, there is a need in the art for a driver for a multi-voltage island/core architecture that addresses, among others, the above described problems.

SUMMARY OF THE INVENTION

A system and method for providing a driver for a multi-voltage island/core architecture of an integrated circuit chip are provided. A complementary metal oxide semiconductor (CMOS) inverter is built with a high threshold voltage p-channel field-effect transistor (hi-Vt PFET) and a regular threshold voltage n-channel field-effect transistor (NFET), which uses the maximum positive voltage supply (Vdd) on the chip. The threshold voltage of the hi-Vt PFET is determined based on the maximum Vdd, the Vdd of the Voltage island/core that drives the CMOS inverter, and a subthreshold leakage current requirement of the hi-Vt PFET.

A first aspect of the invention provides a system for providing a driver for a multi-voltage island/core architecture of an integrated circuit (IC) chip, the system comprising: a p-channel field-effect transistor (PFET) and an n-channel field-effect transistor (NFET), the PFET and the NFET being coupled together to form a complementary metal-oxide semiconductor (CMOS) inverter; wherein a gate pin of the PFET and a gate pin of the NFET are coupled to an output of a first voltage island/core of the multi-voltage island/core architecture; and wherein a source pin of the PFET is coupled to a maximum positive voltage supply (Vdd) on the IC chip; and wherein a threshold voltage of the PFET is determined based on the maximum Vdd, a first Vdd of the first voltage island/core, and a leakage current requirement of the PFET.

A second aspect of the invention provides a multi-voltage island/core architecture of an integrated circuit (IC) chip, the multi-voltage island/core architecture comprising: a first voltage island/core and a second voltage island/core; and a complementary metal-oxide semiconductor (CMOS) inverter including a p-channel field-effect transistor (PFET) and an n-channel field-effect transistor (NFET); wherein a gate pin of the PFET and a gate pin of the NFET are coupled to an output of the first voltage island/core; and wherein a drain pin of the PFET and a drain pin of the NFET are coupled to provide a logic state to the second voltage island/core; and wherein a source pin of the PFET is coupled to a maximum positive voltage supply (Vdd) on the IC chip; and wherein a threshold voltage of the PFET is determined based on the maximum Vdd, a first Vdd of the first Voltage island/core, and a leakage current requirement of the PFET.

A third aspect of the invention provides a method for providing a driver for a multi-voltage island/core architecture of an integrated circuit (IC) chip, the method comprising: providing a complementary metal-oxide semiconductor (CMOS) inverter coupled between a first voltage island/core and a second voltage island/core of the multi-voltage island/core architecture, the CMOS inverter including a p-channel field-effect transistor (PFET) and an n-channel field-effect transistor (NFET), a gate pin of the PFET and a gate pin of the NFET being coupled to an output of the first voltage island/core, a drain pin of the PFET and a drain pin of the NFET being coupled to provide a logic state to the second voltage island/core, a source pin of the PFET being coupled to a maximum positive voltage supply (Vdd) on the IC chip; and determining a threshold voltage of the PFET based on the maximum Vdd, a first Vdd of the first Voltage island/core, and a leakage current requirement of the PFET.

The illustrative aspects of the present invention are designed to solve the problems herein described and/or other problems not discussed.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

It is noted that the drawings of the invention are not to scale. The drawings are intended to depict only typical aspects of the invention, and therefore should not be considered as limiting the scope of the invention. In the drawings, like numbering represents like elements among the drawings.

DETAILED DESCRIPTION

Figure 1:
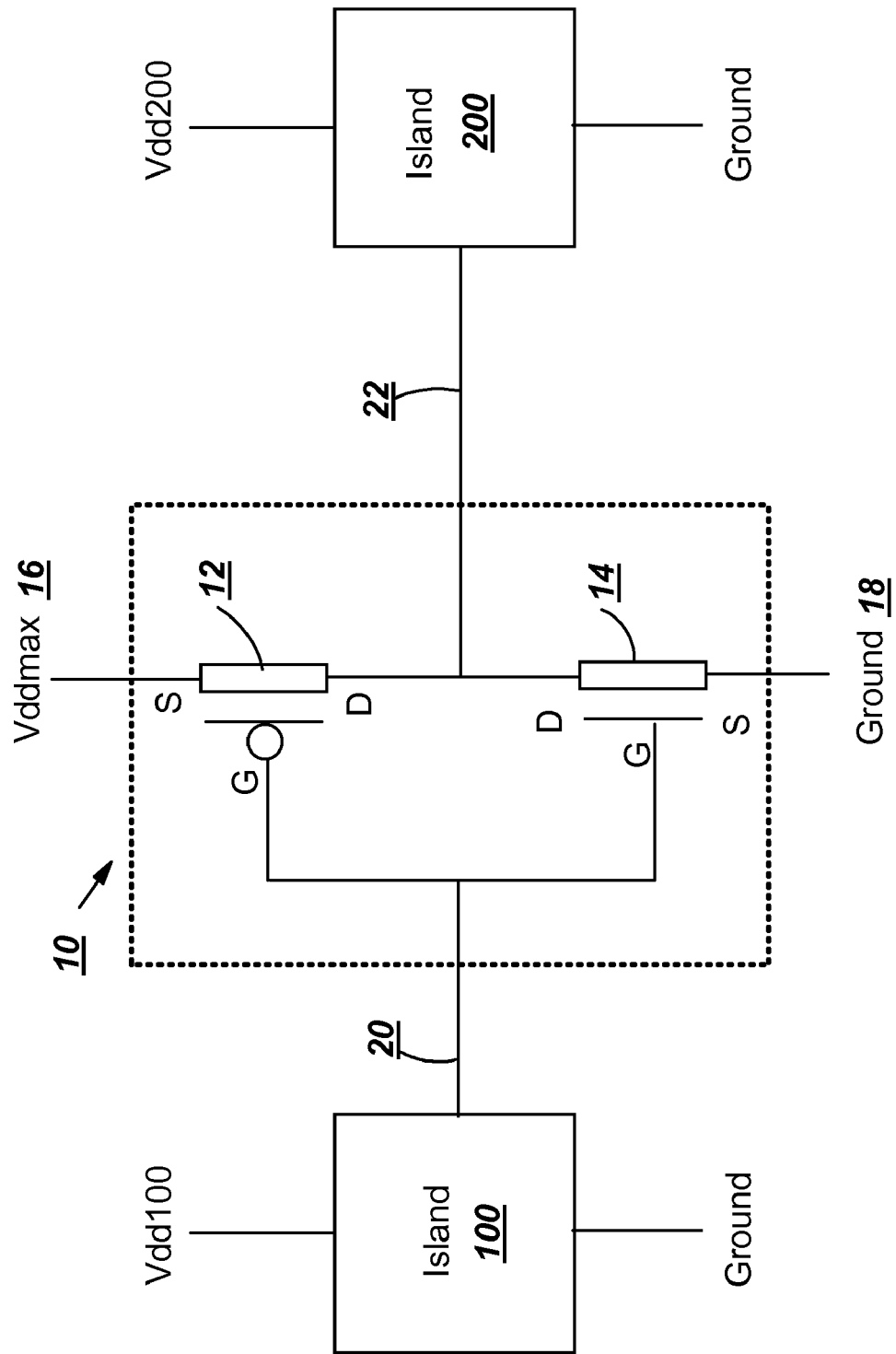
FIG. 1 shows a block diagram of one embodiment of a driver for a multi-voltage island/core architecture according to the invention.

Turning to the drawings, FIG. 1 shows a block diagram of one embodiment of a driver 10 for a multi-voltage island/core of an integrated circuit (IC) chip (not shown). Driver 10 includes a high threshold voltage (hi-Vt) p-channel field-effect transistor (PFET) 12 and a regular threshold voltage n-channel field-effect transistor (NFET) 14, which are coupled together to form a complementary metal oxide semiconductor (CMOS) inverter. Specifically, source pin of hi-Vt PFET 12 is coupled to Vddmax 16, which is the maximum positive voltage supply (Vdd) on the IC chip; source pin of NFET 14 is coupled to chip ground 18; gate pins of hi-Vt PFET 12 and NFET 14 are coupled to form an input terminal 20 of driver 10; and drain pins of hi-Vt PFET 12 and NFET 14 are coupled to form an output terminal 22 of driver 10.

In FIG. 1, two voltage islands/cores (islands) 100 and 200 are coupled to driver 10 such that output of island 100 controls driver 10 to provide logic state to island 200. Specifically, the output of island 100 is couple to input terminal 20 of driver 10; and island 200 is coupled to output terminal 22 of driver 10. Island 100 includes Vdd100; and island 200 includes Vdd200.

The current invention takes advantage of a high threshold voltage of hi-Vt PFET 12 to maintain a low subthreshold leakage current and increase noise margin. As is described above, the threshold voltage of hi-Vt PFET 12 cannot be increased unlimitedly because performance of driver 10, for example, rise time, may decrease due to an increase of hi-Vt PFET 12 threshold voltage. The following formulae represent an optimal threshold voltage required for hi-Vt PFET 12 to meet a subthreshold leakage requirement:

$$I_{off} = I_{vt} * (W/L) * \exp\{2.3[Vt-(Vdd\max-Vdd100)]/S\} \quad (1)$$

or $$Vt = Vdd\max - Vdd1 + S*\log[(I_{vt}*W/L)/I_{off}] \quad (2)$$

Where Vt indicates threshold voltage of hi-Vt PFET 12; $I_{off}$ indicates subthreshold leakage current of hi-Vt PFET 12; $I_{vt}$ indicates the current at threshold voltage of hi-Vt PFET 12; S indicates threshold slope factor of hi-Vt PFET 12; W/L indicates the width/length ratio of hi-Vt PFET 12; Vddmax indicates the maximum chip Vdd; and Vdd1 indicates the Vdd of the island located before driver 10, here Vdd100.

For example, according to one embodiment of the invention, hi-Vt PFET 12 has the typical $I_{vt}$ of 70 nA, S of 85 mV/dec, and a W/L of 1. Also, a subthreshold leakage current ($I_{off}$) less than 1% of the current at threshold voltage ($I_{vt}$), i.e., 0.7 nA, is required. For illustration purpose, a Vdd100 of 500 mV and a Vddmax of 800 mV are provided as examples. Incorporating the above values into formula (2), a value of threshold voltage (Vt) of 470 mV can be obtained for hi-Vt PFET 12. This is considered the optimal threshold voltage for hi-Vt PFET 12 to maintain the subthreshold leakage current ($I_{off}$) less than 1% of the current at threshold voltage ($I_{vt}$).

There are various approaches to produce hi-Vt PFET 12. For example, according to one embodiment, hi-Vt PFET 12 may be fabricated using standard ion implantation to adjust the body doping of the wafer that hi-Vt PFET 12 is made from. According to another embodiment, the threshold voltage of hi-Vt PFET 12 may also be increased by applying a back bias voltage to the hi-Vt PFET 12 body.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of the invention as defined by the accompanying claims.

What is claimed is:

1. A system for providing a driver for a multi-voltage island/core architecture of an integrated circuit (IC) chip, the system comprising:
    a p-channel field-effect transistor (PFET) and an n-channel field-effect transistor (NFET), the PFET and the NFET being coupled together to form a complementary metal-oxide semiconductor (CMOS) inverter;
    wherein a gate pin of the PFET and a gate pin of the NFET are coupled to an output of a first voltage island/core of the multi-voltage island/core architecture; and wherein a source pin of the PFET is coupled to a maximum positive voltage supply (Vdd) on the IC chip; and wherein a threshold voltage of the PFET is determined based on the maximum Vdd, a first Vdd of the first voltage island/core, and a leakage current requirement of the PFET.

2. The system of claim 1, wherein the threshold voltage of the PFET is determined using the equation:

$$Vt = Vdd\max - Vdd1 + S*\log[(I_{vt}*W/L)/I_{off}],$$

where Vt denotes the threshold voltage; $I_{off}$ denotes the leakage current requirement; $I_{vt}$ denotes a current at threshold voltage of the PFET; S denotes a threshold slope factor of the PFET; W/L denotes a width/length ratio of the PFET; Vddmax denotes the maximum Vdd; and Vdd1 denotes the first Vdd.

3. The system of claim 1, wherein a drain pin of the PFET and a drain pin of the NFET are coupled to provide a logic state to a second voltage island/core.

4. A multi-voltage island/core architecture of an integrated circuit (IC) chip, the multi-voltage island/core architecture comprising:
    a first voltage island/core and a second voltage island/core; and
    a complementary metal-oxide semiconductor (CMOS) inverter including a p-channel field-effect transistor (PFET) and an n-channel field-effect transistor (NFET);
    wherein a gate pin of the PFET and a gate pin of the NFET are coupled to an output of the first voltage island/core; and wherein a drain pin of the PFET and a drain pin of the NFET are coupled to provide a logic state to the second voltage island/core; and wherein a source pin of the PFET is coupled to a maximum positive voltage supply (Vdd) on the IC chip; and wherein a threshold voltage of the PFET is determined based on the maximum Vdd, a first Vdd of the first Voltage island/core, and a leakage current requirement of the PFET.

5. The architecture of claim 4, wherein the threshold voltage of the PFET is determined using the equation:

$$Vt = Vdd\max - Vdd1 + S*\log[(I_{vt}*W/L)/I_{off}],$$

where Vt denotes the threshold voltage; $I_{off}$ denotes the leakage current requirement; $I_{vt}$ denotes a current at threshold voltage of the PFET; S denotes a threshold slope factor of the PFET; W/L denotes a width/length ratio of the PFET; Vddmax denotes the maximum Vdd; and Vdd1 denotes the first Vdd.

6. The architecture of claim 4, wherein the maximum Vdd and the first Vdd are the same.

7. The architecture of claim 4, wherein the maximum Vdd and the first Vdd are different than each other.

8. A method for providing a driver for a multi-voltage island/core architecture of an integrated circuit (IC) chip, the method comprising:
    providing a complementary metal-oxide semiconductor (CMOS) inverter coupled between a first voltage island/core and a second voltage island/core of the multi-voltage island/core architecture, the CMOS inverter including a p-channel field-effect transistor (PFET) and an n-channel field-effect transistor (NFET), a gate pin of the PFET and a gate pin of the NFET being coupled to an output of the first voltage island/core, a drain pin of the PFET and a drain pin of the NFET being coupled to provide a logic state to the second voltage island/core, a source pin of the PFET being coupled to a maximum positive voltage supply (Vdd) on the IC chip; and determining a threshold voltage of the PFET based on the maximum Vdd, a first Vdd of the first Voltage island/core, and a leakage current requirement of the PFET.

9. The method of claim 8, wherein the threshold voltage of the PFET is determined using the equation:

$$Vt = Vdd\max - Vdd1 + S*\log\left[(I_{vt}*W/L)/I_{off}\right],$$

where Vt denotes the threshold voltage; $I_{off}$ denotes the leakage current requirement; $I_{vt}$ denotes a current at threshold voltage of the PFET; S denotes a threshold slope factor of the PFET; W/L denotes a width/length ratio of the PFET; Vddmax denotes the maximum Vdd; and Vdd1 denotes the first Vdd.

10. The method of claim 8, wherein the providing step includes fabricating the PFET using ion implantation to adjust a body doping of a wafer to achieve the threshold voltage of the PFET.

11. The method of claim 8, wherein the providing step includes increasing the threshold voltage of the PFET by applying a back bias voltage to the PFET body.

* * * * *